(12) United States Patent
Nosaka et al.

(10) Patent No.: US 11,984,885 B2
(45) Date of Patent: May 14, 2024

(54) SEMICONDUCTOR CIRCUIT (71) Applicant: OMRON Corporation, Kyoto (JP)

(72) Inventors: Noriyuki Nosaka, Kyoto (JP); Chen Chen, Kyoto (JP); Takanori Ishii, Kyoto (JP); Wataru Okada, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 55 days.

(21) Appl. No.: 17/793,847

(22) PCT Filed: Dec. 16, 2020

(86) PCT No.: PCT/JP2020/046903
§ 371 (c)(1),
(2) Date: Jul. 19, 2022

(87) PCT Pub. No.: WO2021/157207
PCT Pub. Date: Aug. 12, 2021

(65) Prior Publication Data
US 2023/0043841 A1 Feb. 9, 2023

(30) Foreign Application Priority Data
Feb. 4, 2020 (JP) ................................. 2020-017176

(51) Int. Cl.
*H03K 17/687* (2006.01)
*H02M 1/08* (2006.01)
*H02M 7/537* (2006.01)

(52) U.S. Cl.
CPC ........... *H03K 17/6871* (2013.01); *H02M 1/08* (2013.01); *H02M 7/537* (2013.01)

(58) Field of Classification Search
CPC ......... H03K 17/6871; H03K 17/08142; H03K 17/122; H02M 1/08
See application file for complete search history.

(56) References Cited

U.S. PATENT DOCUMENTS

| | | | | |
|---|---|---|---|---|
| 9,994,110 B2 * | 6/2018 | Xu | ......................... | H02M 7/003 |
| 2008/0061710 A1 * | 3/2008 | Ushijima | ........... | H05B 41/2822 |
| | | | | 315/277 |

(Continued)

FOREIGN PATENT DOCUMENTS

| | | |
|---|---|---|
| EP | 3300234 A1 | 3/2018 |
| JP | 3421544 B2 | 6/2003 |

(Continued)

OTHER PUBLICATIONS

WIPO 2019/116737 (Year: 2019).*

(Continued)

*Primary Examiner* — Sibin Chen
(74) *Attorney, Agent, or Firm* — ROSSI, KIMMS & McDOWELL LLP (57) ABSTRACT

A semiconductor circuit includes: a first inductor part configured to connect in series with a source electrode of a first semiconductor element; and a second inductor part configured to connect in series with a source electrode in a second semiconductor element that is configured to connect in parallel with the first semiconductor element; the first inductor part and the second inductor part are arranged to generate an induced electromotive force in the first inductor part and the second inductor part by way of a magnetic interaction so that the currents flowing in the first inductor part and the second inductor part are reinforced in the same direction.

4 Claims, 9 Drawing Sheets

(56) References Cited

U.S. PATENT DOCUMENTS

2016/0087418 A1      3/2016  Koffler et al.
2016/0352327 A1     12/2016  Wang
2016/0352330 A1     12/2016  Mao et al.
2016/0352331 A1*    12/2016  Wang ................... H03K 17/145

FOREIGN PATENT DOCUMENTS

| JP | 2007159297 A | 6/2007 |
| JP | 2015018943 A | 1/2015 |
| JP | 2017175602 A | 9/2017 |
| WO | 2019116737 A1 | 6/2019 |

OTHER PUBLICATIONS

International Search Report issued in Intl. Appln. No. PCT/JP2020/046903 dated Feb. 22, 2021. English translation provided.
Written Opinion issued in Intl. Appln. No. PCT/JP2020/046903 dated Feb. 22, 2021. English translation provided.
Extended European Search Report issued in European Appln. No. 20918002.5, dated Nov. 22, 2023.

* cited by examiner

$$V_1 = j\omega L_1 I_{d1} - \boxed{j\omega k_1 \sqrt{L_1 L_2} I_{d2}} - \boxed{j\omega k_2 \sqrt{L_1 L_4} I_{d1}} \quad \ldots (1)$$

$$V_2 = j\omega L_2 I_{d2} - \boxed{j\omega k_1 \sqrt{L_1 L_2} I_{d1}} - \boxed{j\omega k_2 \sqrt{L_2 L_3} I_{d2}} \quad \ldots (2)$$

$$V_3 = j\omega L_4 I_{d1} \boxed{- j\omega k_2 \sqrt{L_1 L_4} I_{d1}} \quad \ldots (3)$$

$$V_4 = j\omega L_3 I_{d2} \boxed{- j\omega k_2 \sqrt{L_2 L_3} I_{d2}} \quad \ldots (4)$$

☐ ... Current Balancing Term

☐ ... Voltage-surge Suppressing Term

FIG. 7B

SEMICONDUCTOR CIRCUIT

TECHNICAL FIELD

The present invention relates to a semiconductor circuit.

BACKGROUND

There is disclosed a semiconductor device in which a plurality of semiconductor elements is connected in parallel (for example, Patent Documents 1-2).

RELATED ART DOCUMENTS

Patent Documents

[Patent Document 1] Japanese Patent No. 3421544
[Patent Document 2] Japanese Patent Publication No. 2017-175602

SUMMARY

Technical Problem

A plurality of semiconductor elements may be caused to each perform a switching operation by applying a gate voltage to each of the semiconductor elements. In this case, the size of the drain current flowing in the semiconductor elements may be varied. Therefore, for instance, Patent Document 1 provides a source inductance that is shared between a gate circuit and a main circuit in which the respective semiconductor elements are arranged. This kind of common source inductance generates an electromotive force in accordance with the size of the drain current flowing in the semiconductor element, with the electromotive force producing a current flowing in the reverse of the direction of said drain current. The gate voltage on a semiconductor element is adjusted so that the electromotive force generated minimizes the variation in the size of the drain current.

Patent Document 2, for example, also mutually couples the inductance of a gate node in one semiconductor element and the inductance of a drain node in another semiconductor element. In the case of such a structure, the coupled portion generates an electromotive force in accordance with the size of the drain current flowing in the semiconductor element with the electromotive force producing a current flowing in the reverse of the direction of said drain current. Therefore, if the size of the drain current in one semiconductor element is greater than the size of the drain current in another semiconductor element, for example, the gate voltage of the other semiconductor element may be adjusted to increase the size of the drain current flowing in the other semiconductor element. The variation in the size of the drain current flowing in the semiconductor elements may thus be minimized.

The above kind of method for minimizing the variation in the drain currents suggests providing a larger impedance to the gate circuit and the main circuit in order to be able to handle any sharp drain current. However, providing a larger impedance suggests that a sharp noise may also be generated in the gate circuit caused by the sharp drain current in the main circuit. Accordingly, this suggests that the switching operation of a semiconductor element may cause a malfunction to occur. If the switching of a semiconductor element is a malfunction, this suggests that a current exceeding the breakdown voltage of the semiconductor element may flow in a circuit in a semiconductor device and destroy the device.

This also suggests that a large deviation may occur in the power loss when switching a semiconductor element where the switching operation is malfunctioning, and this may likely have a large impact on the heat generated in or the operating life of the semiconductor device.

In view of the above situation, the present invention aims to reduce as much as possible the impact on a semiconductor device when minimizing the variation in the size of the current flowing in each semiconductor element of a semiconductor device containing the aforementioned semiconductor elements connected in parallel.

Solution to Problem

To address the above described disadvantages, the present invention adopts the following configurations.

That is, a semiconductor circuit according to one aspect of the present invention includes: a first inductor part configured to connect in series with a source electrode of a first semiconductor element; and a second inductor part configured to connect in series with a source electrode in a second semiconductor element that is configured to connect in parallel with the first semiconductor element; the first inductor part and the second inductor part are arranged to generate an induced electromotive force in the first inductor part and the second inductor part by way of a magnetic interaction, so that the currents flowing in the first inductor part and the second inductor part are reinforced in the same direction.

The aforementioned configuration minimizes the variation by way of the induced electromotive force mutually generated between the first inductor and the second inductor, even when there is a variation in the quantity of current flowing in the first semiconductor element and the second semiconductor element. The aforementioned configuration also achieves minimizing the variation in the quantity of current without needing to provide a large impedance to the gate circuit. Therefore, the aforementioned configuration reduces the impact on a semiconductor device as much as possible.

The semiconductor circuit according to the above one aspect may further include: a third inductor part configured to connect in series with the first inductor part; and a fourth inductor part configured to connect in series with the second inductor part; wherein the third inductor part is arranged to produce a voltage by way of a first induced electromotive force generated due to a magnetic interaction originating from the first inductor part, said voltage of an opposite direction to the voltage applied to the third inductor part itself, and to produce a voltage in the first inductor part by way of the first induced electromotive force generated due to a magnetic interaction from the third inductor part itself, said voltage of an opposite direction to the voltage applied to the first inductor part; and the fourth inductor part is arranged to produce a voltage by way of a second induced electromotive force generated due to a magnetic interaction originating from the second inductor part, said voltage of an opposite direction to the voltage applied to the fourth inductor part itself, and to produce a voltage in the second inductor part by way of the second induced electromotive force generated due to a magnetic interaction from the fourth inductor part itself, said voltage of an opposite direction to the voltage applied to the second inductor part.

The aforementioned configuration is such that when a surge voltage is produced in a circuit that is provided with the first inductor part and the third inductor part, the induced electromotive force mutually generated between the first inductor part and the third inductor part produces a voltage in the aforementioned circuit which is the opposite direction to the direction that the aforementioned surge voltage is applied. Therefore, it is possible to reduce a surge voltage. When a surge voltage is produced in a circuit that is provided with the second inductor part and the fourth inductor part, the induced electromotive force mutually generated between the second inductor part and the fourth inductor part similarly produces a voltage in the aforementioned circuit which is the opposite direction to the direction the aforementioned surge voltage is applied. Therefore, it is possible to reduce a surge voltage. Therefore, the impact on a semiconductor device can be reduced as much as possible.

The semiconductor circuit according to the above one aspect may be such that at least one of the first inductor part, second inductor part, third inductor part, and fourth inductor part includes a parasitic inductance.

The aforementioned configuration is such that there is no need to provide parts that generate a mutually induced electromotive force for minimizing the variation in the quantity of current or reducing the surge voltage. Therefore, the number of parts needed to create the circuit is reduced. Therefore, this simplifies the process for manufacturing the circuit, decreases the cost of maintaining parts, or reduces the parts cost, etc.

The semiconductor circuit according to the above one aspect may include: a plurality of metal layers which are stacked, and an insulating part provided between the plurality of metal layers; and a prescribed pair of facing metal layers from among the plurality of stacked metal layers is electrically connected in parallel; and the prescribed pair of metal layers is the first inductor part and the second inductor part.

The aforementioned configuration is such that an induced electromotive force is mutually generated in a prescribed pair of metal layers respectively to minimize the variation in the quantity of current flowing through said prescribed pair of metal layers. In other words, there is no need to provide parts for generating a mutually induced electromotive force for minimizing the variation in the quantity of current. Therefore, the number of parts needed to create the circuit is reduced. Therefore, this simplifies the process for manufacturing the circuit, decreases the cost of maintaining parts, or reduces the parts cost, etc.

The semiconductor circuit according to the above one aspect may be such that the prescribed pair of metal layers is formed from a first metal layer and a second metal layer; a third metal layer facing the first metal layer is divided into a first portion and a second portion by the insulating part; the first portion, the first metal layer, and the second portion are electrically connected in series; a fourth metal layer facing the second metal layer is divided into a third portion and a fourth portion by the insulating part; the third portion, the second metal layer, and the fourth portion are electrically connected in series; the first metal layer is the first inductor part; the second metal layer is the second inductor part; the second portion of the third metal layer is the third inductor part; and the fourth portion of the fourth metal layer is the fourth inductor part.

The aforementioned configuration is such that when a surge voltage is generated in the first portion of the third metal layer, the first metal layer, and the second portion of the third metal layer which are connected in series, an induced electromotive force is generated in the first metal layer and the second portion of the third metal layer in the reverse direction of the direction the surge voltage is applied. Therefore, it is possible to reduce the aforementioned surge voltage. When a surge voltage is generated in the third portion of the fourth metal layer, the second metal layer, and the fourth portion of the fourth metal layer which are connected in series, similarly an induced electromotive force is mutually generated in the second metal layer and the fourth portion of the fourth metal layer in the reverse direction of the direction the surge voltage is applied. Therefore, it is possible to reduce the aforementioned surge voltage. In other words, the semiconductor elements are mounted on the first portion of the third metal layer and the third portion of the fourth metal layer, and there is no need to provide parts for generating a mutually generated electromotive force for reducing the surge voltage when a current flows through the semiconductor elements. Therefore, the number of parts needed to create the circuit is reduced. Therefore, this simplifies the process for manufacturing the circuit, decreases the cost of maintaining parts, or reduces the parts cost, etc.

The means in the present invention for addressing the above disadvantages may be combined as appropriate and used.

Effects

The present invention can reduce as much as possible the impact on a semiconductor device when minimizing the variation in the size of the current flowing in each semiconductor element of a semiconductor device containing the aforementioned semiconductor elements connected in parallel.

DETAILED DESCRIPTION

1. Example Application

Figure 1:
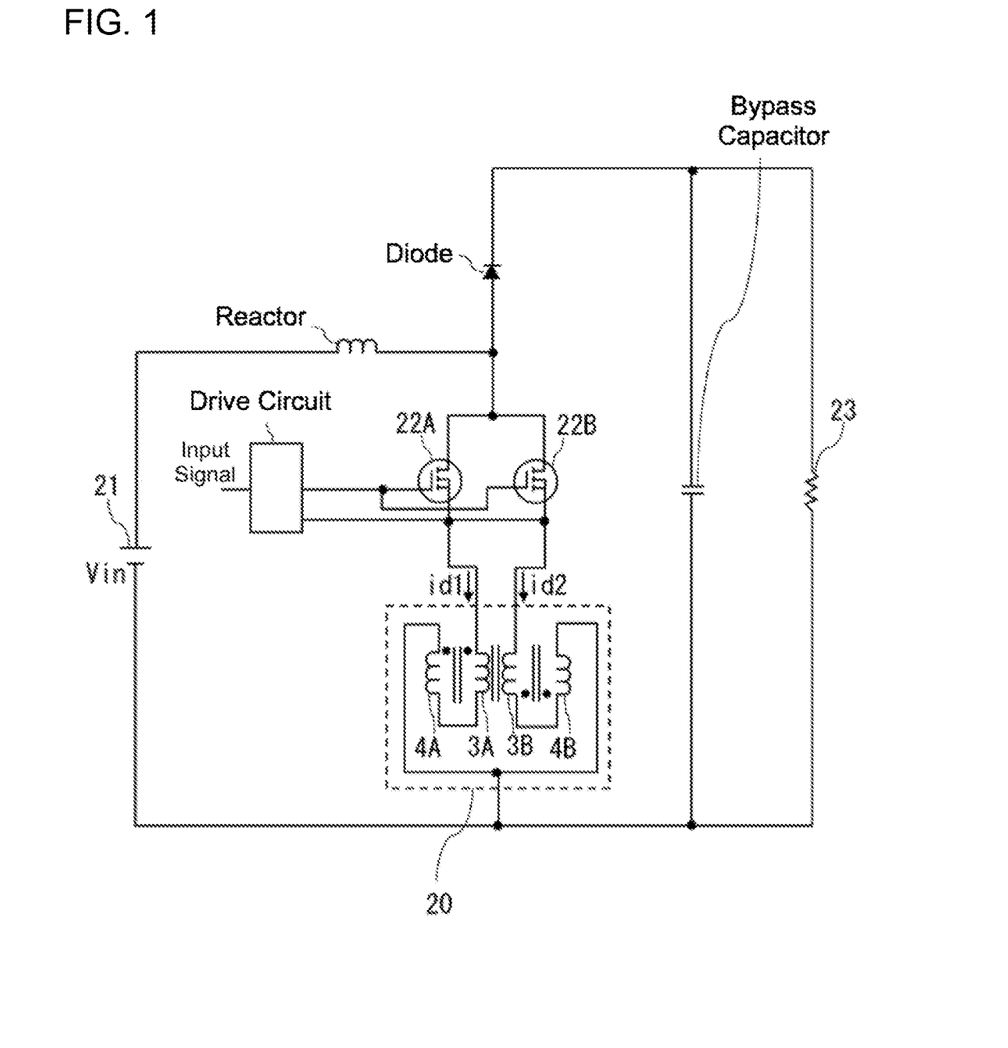
FIG. 1 illustrates a schematic of a current balance adjustment circuit according to an embodiment.

An example application of the present invention is described in detail below with reference to the drawings. FIG. 1 illustrates a schematic of a current balance adjustment circuit 20 according to an embodiment; the current balance adjustment circuit 20 is provided with a coil 3A and a coil 3B. The coils 3A, 3B are connected in series with a switching element 22A and a switching element 22B respectively, and the switching elements are connected in parallel with an input power source 21. The coils 3A, 3B are arranged so that the S pole of the coil 3A and the N pole of the coil 3B are adjacent, and so that the N pole of the coil 3A and the S pole of the coil 3B are adjacent.

The current balance adjustment circuit 20 is also provided with a coil 4A and a coil 4B. The coil 4A is connected in series with the coil 3A. The coil 4A and the coil 3A are arranged so that the S poles thereof are adjacent and the N poles thereof are adjacent. The coil 4B and the coil 3B are similarly connected in series. The coil 4B and the coil 3B are arranged so that the S poles thereof are adjacent and the N poles thereof are adjacent.

Even when there is a variation in the quantity of current id1 and the quantity of current id2 flowing in the switching elements 22A, 22B, the above described kind of current balance adjustment circuit 20 minimizes the variation by way of the induced electromotive force mutually generated between the coil 3A and the coil 3B. Therefore, the above described kind of current balance adjustment circuit 20 is capable of reducing the impact on a semiconductor device as much as possible.

The above kind of current balance adjustment circuit 20 is such that when a surge voltage is produced in a circuit that is provided with the coil 3A and the coil 4A, the induced electromotive force mutually generated between the coil 3A and the coil 4A produces a voltage in the aforementioned circuit which is the opposite direction to the direction that the aforementioned surge voltage is applied. Therefore, it is possible to reduce a surge voltage. When a surge voltage is produced in a circuit that is provided with the coil 3B and the coil 4B, the induced electromotive force mutually generated between the coil 3B and the coil 4B similarly produces a voltage in the aforementioned circuit which is the opposite direction to the direction the aforementioned surge voltage is applied. Therefore, it is possible to reduce a surge voltage. Therefore, the impact on a semiconductor device can be reduced as much as possible.

2. Example Configuration

Hardware Configuration

An embodiment of the present invention is described next with reference to the drawings.

FIG. 1 illustrates a schematic of a current balance adjustment circuit 20 of the embodiment (one example of a "circuit" in this disclosure). The current balance adjustment circuit 20 is provided with a coil 3A (one example of a "first inductor part" in this disclosure) and a coil 3B (one example of a "second inductor part" in this disclosure). The coils 3A, 3B are connected in series to a switching element 22A (one example of a "first semiconductor element" in this disclosure) and a switching element 22B (one example of a "second semiconductor element" in this disclosure), respectively, and the switching elements are connected in parallel to an input power source 21. Here, the switching elements 22A, 22B may be metal-oxide-semiconductor field-effect transistors (MOS-FETs). An input voltage Vin is applied between the source and drain of the switching elements 22A, 22B respectively from the input power source 21. These kinds of switching elements 22A, 22B control the flow of current between the source and drain by controlling the gate signal voltages respectively, to adjust the power supply supplied to the load 23 from the input power source 21. A magnetic field is produced in the coils 3A, 3B when a current flows in the coils 3A, 3B. The coils 3A, 3B are arranged so that the S pole of the magnetic field created by the coil 3A and the N pole of the magnetic field created by the coil 3B are adjacent, and the N pole of the magnetic field created by the coil 3A and the S pole of the magnetic field created by the coil 3B are adjacent (referred to below as "coupled by opposite poles"). Thus, the arrangement of the coils 3A, 3B produces a magnetic interaction in the coils 3A, 3B.

The current balance adjustment circuit 20 is also provided with a coil 4A (one example of a "third inductor part" in this disclosure) and a coil 4B (one example of a "fourth inductor part" in this disclosure). The coil 4A is connected in series with the coil 3A. A magnetic field is produced in the coil 4A when a current flows in the coil 4A. The coil 4A and the coil 3A are arranged so that the S poles of the magnetic fields created by each coil are adjacent, and the N poles of the magnetic fields created by each coil are adjacent (referred to below as "coupled by like poles"). Thus, the arrangement of the coils 3A, 4A produces a magnetic interaction in the coils 3A, 4A. The coil 4B and the coil 3B are similarly connected in series. A magnetic field is produced in the coil 4B when a current flows in the coil 4B. The coil 3B and the coil 4B are arranged so that the S poles of the magnetic fields created by each coil are adjacent, and the N poles of the magnetic fields created by each coil are adjacent (referred to below as "coupled by like poles"). Thus, the arrangement of the coils 3B, 4B produces a magnetic interaction in the coils 3B, 4B.

Operation Example

When a voltage is applied to the gates of each of the above-described switching elements 22A, 22B, a quantity of current id1 flows to the coil 3A from the switching element 22A. An electromotive force is generated in the coil 3A, producing a current of the reverse direction to the direction in which the quantity of current id1 itself is flowing. A quantity of current id2 similarly flows to the coil 3B from the switching element 22B. An electromotive force is generated in the coil 3B, producing a current of the reverse direction to the direction in which the quantity of current id2 itself is flowing.

An induced electromotive force responsive to the quantity of current id2 flowing in the coil 3B is also generated in the coil 3A due to the coil 3B coupled thereto by reverse poles. A current flows in the same direction as the direction that the quantity of current id2 flows due to the induced electromotive force. An induced electromotive force responsive to the quantity of current id1 flowing in the coil 3A is similarly generated in the coil 3B due to the coil 3A coupled thereto by reverse poles. A current flows in the same direction as the direction that the quantity of current id1 flows due to the induced electromotive force.

The quantity of current id1 that passed through the coil 3A also flows into the coil 4A. Consequently, an electromotive force is generated in the coil 4A, producing a current of a reverse direction to the direction in which the quantity of current id1 itself is flowing. The size of the aforementioned electromotive force is a value responsive to the size of the quantity of current id1 that passed therethrough. The quantity of current id2 that passed through the coil 3B similarly flows into the coil 4B. Consequently, an electromotive force is generated in the coil 4B, producing a current of the reverse direction to the direction in which the quantity of current id2 itself is flowing; the size of the aforementioned electromotive force is a value responsive to the size of the quantity of current id2 that passed therethrough.

Figure 2:
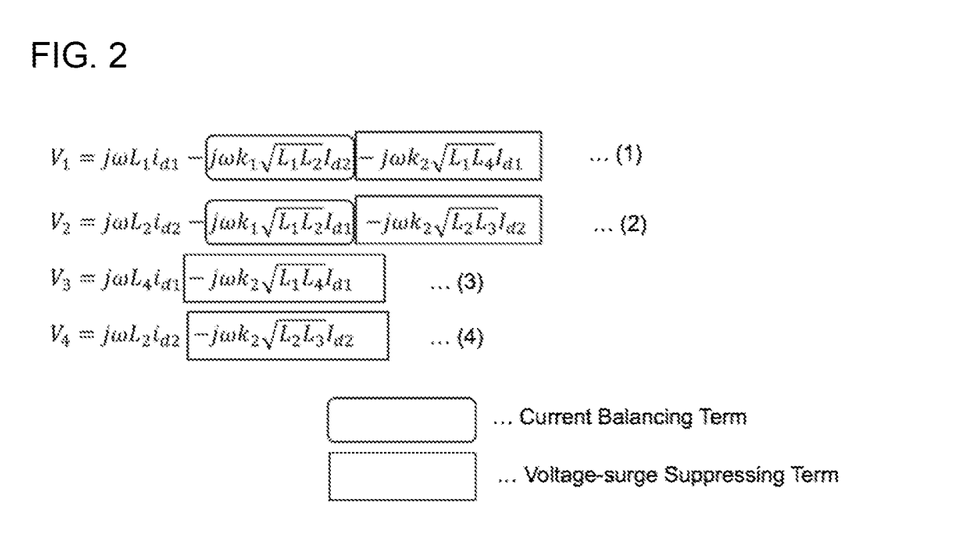
FIG. 2 illustrates one example of an electromotive force generated in a coil.

An induced electromotive force responsive to the quantity of current id1 flowing in the coil 3A is generated in the coil 4A due to the coil 3A coupled thereto by like poles (one example of the "first induced electromotive force" in this disclosure). The induced electromotive force causes the current to flow in the reverse direction to the direction of the quantity of current id1 flowing in the coil 4A. An induced electromotive force responsive to the quantity of current id2 flowing in the coil 3B is similarly generated in the coil 4B due to the coil 3B coupled thereto by like poles (one example of the "second induced electromotive force" in this disclosure). The induced electromotive force causes the current to flow in the reverse direction to the direction of the quantity of current id2 flowing in the coil 4B. FIG. 2 is a diagram of a collection of electromotive forces V1-V4 which are produced in the coils 3A, 3B and the coils 4A, 4B as above described. Note that the direction of the electromotive forces V1, V3 takes the opposite direction to the direction the quantity of current id1 flows as positive. Further, the direction of the electromotive forces V2, V4 takes the opposite direction to the direction the quantity of current id2 flows as positive.

Here, L1-L4 are the self-inductances of the coils 3A, 3B and the coils 4A, 4B, respectively; ω is the angular frequency; k1 is the magnetic coupling coefficient of the coil 3A and the coil 3B; and k2 is a magnetic coupling coefficient of the coil 3A and the coil 4A, and the coil 3B and the coil 4B.

Figure 3A:
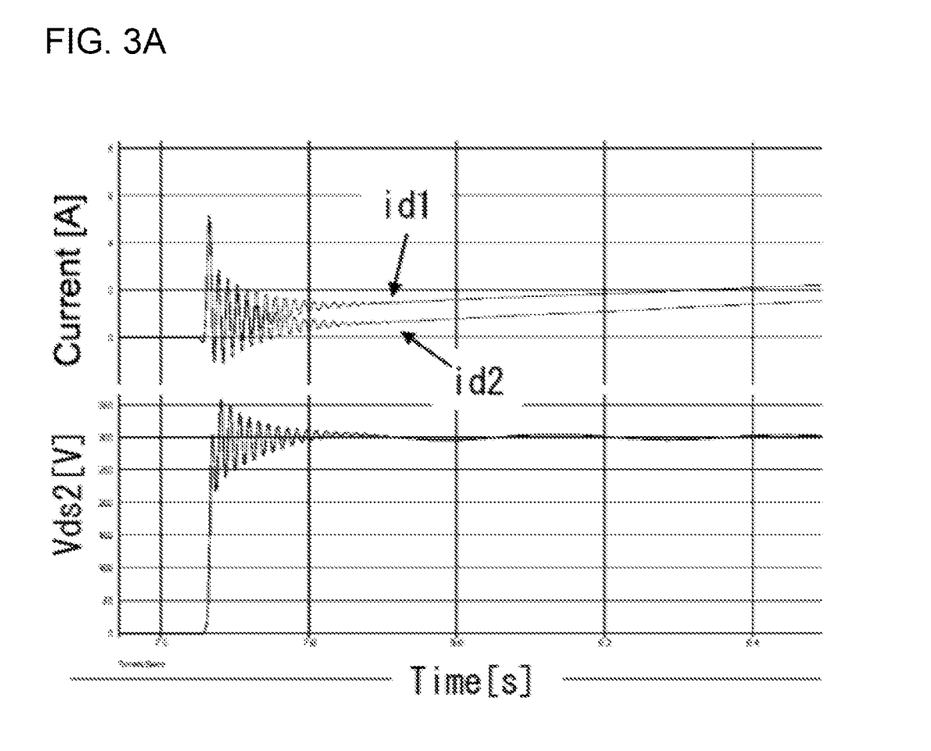
FIGS. 3A, 3B, and 3C illustrate the result of simulating a time-dependent change in the quantity of current and the voltage when a voltage is applied to the gates of the switching elements.
Figure 3B:
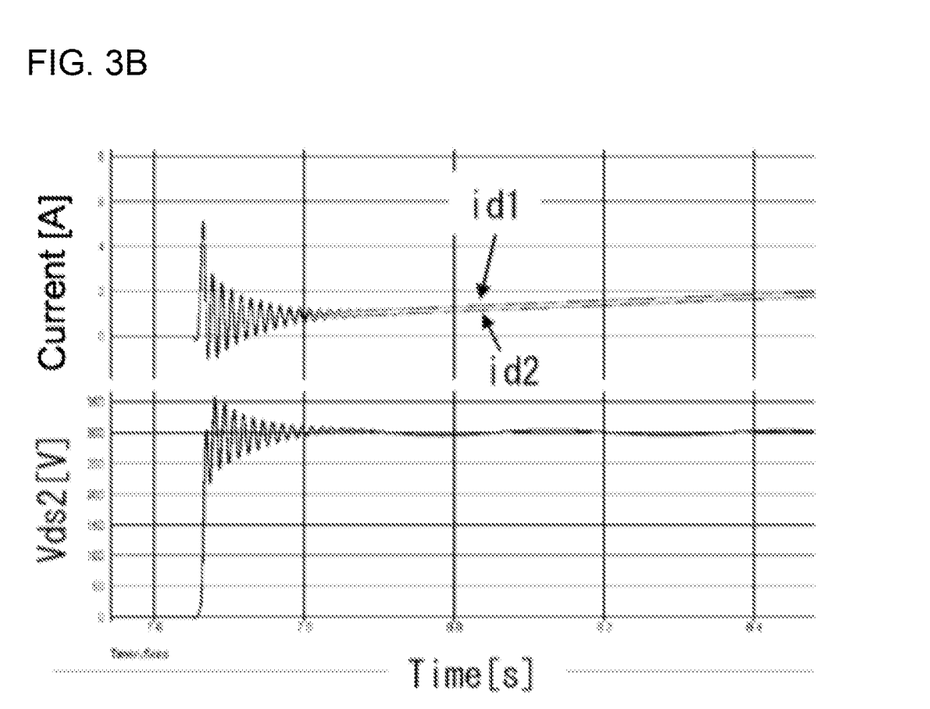
Figure 3C:
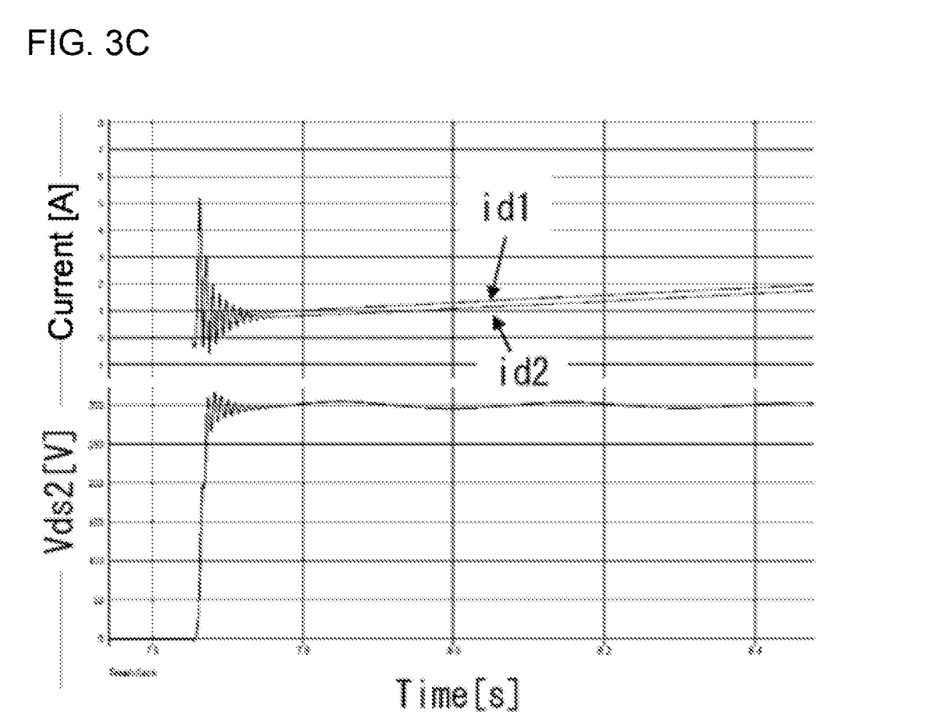
Figure 4:
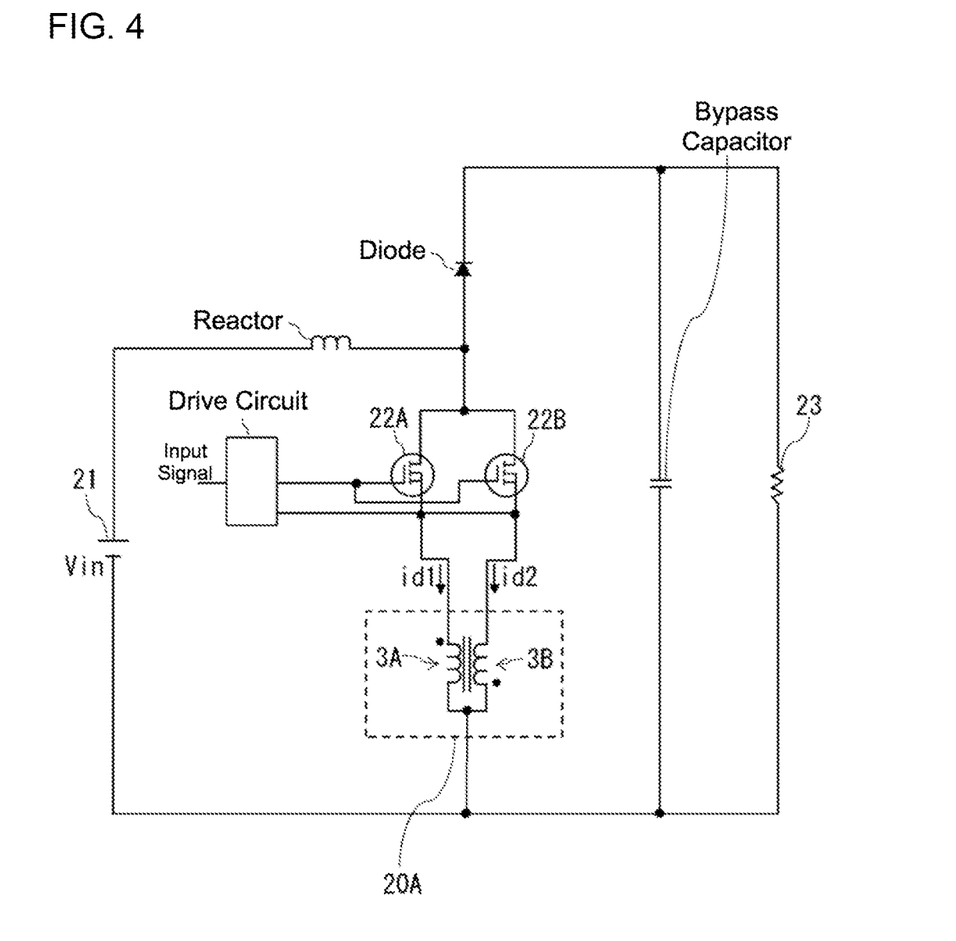
FIG. 4 illustrates a schematic of a current balance adjustment circuit without some coils.

FIG. 3 illustrates the result of simulating a time-dependent change in the quantity of current id1, the quantity of current id2, and a voltage Vds2 applied to a load 23 when a voltage is applied to the gates in the switching elements 22A, 22B respectively (referred to below as "switched on"). FIG. 3 compares when the current balance adjustment circuit 20 of the embodiment is connected to the switching elements 22A, 22B respectively (FIG. 3C), when the current balance adjustment circuit 20 is not connected to the switching elements 22A, 22B respectively (FIG. 3A), and when the circuit includes coils 3A, 3B but does not include the coils 4A, 4B and a current balance adjustment circuit 20A is connected to the switching elements 22A, 22B respectively (FIG. 3B). A schematic of the current balance adjustment circuit 20A is shown, for example, in FIG. 4.

As illustrated in FIG. 3A, in the case where a current balance adjustment circuit 20 is not connected, when the switching elements 22A, 22B are switched on, the quantity of current id1, quantity of current id2, and the voltage Vds2 each oscillate while gradually converging to a fixed value. The quantity of current id1 and the quantity of current id2 vary when the switching elements are first switched on; the convergence values thereof are also each different. Vds2 oscillates wildly when the switching elements are first switched on, and it can be understood therefrom that a surge voltage is generated.

Meanwhile, as illustrated in FIG. 3B, when coils 3A, 3B are present, the coils 4A, 4B are not present, and a current balance adjustment circuit 20A is connected, the variation of the quantity of current id1 and quantity of current id2 is minimized compared to FIG. 3A. The difference in the convergence value of the quantity of current id1 and the convergence value of the quantity of current id2 also decreases. Therefore, coupling the coils 3A, 3B via reverse poles can be said to produce the effect of minimizing the variation between the quantity of current id1 and the quantity of current id2. That is, the second terms on the right sides of the Equation (1) and the Equation (2), respectively depicted in FIG. 2 can be said to be effective for minimizing the variation between the quantity of current id1 and the quantity of current id2.

As illustrated in FIG. 3C, when a current balance adjustment circuit 20 is connected, the variation in the quantity of current id1 and the quantity of current id2 is minimized similarly to FIG. 3B. The difference in the convergence value of the quantity of current id1 and the convergence value of the quantity of current id2 also decreases. Further, in FIG. 3C, the oscillation of voltage Vds2 is small when the switching elements are first switched on and the voltage Vds2 quickly converges to a fixed value. Therefore, coupling the coil 3A and the coil 4A, and the coil 3B and the coil 4B by like poles can be said to have the effect of minimizing oscillation (surge voltage) in Vds2. In other words, the third terms on the right sides of the Equation (1) and the Equation (2), respectively and the second terms on the right sides of the Equation (3) and the Equation (4), respectively, can be said to be effective for minimizing a surge voltage.

Usage Example

Figure 5:
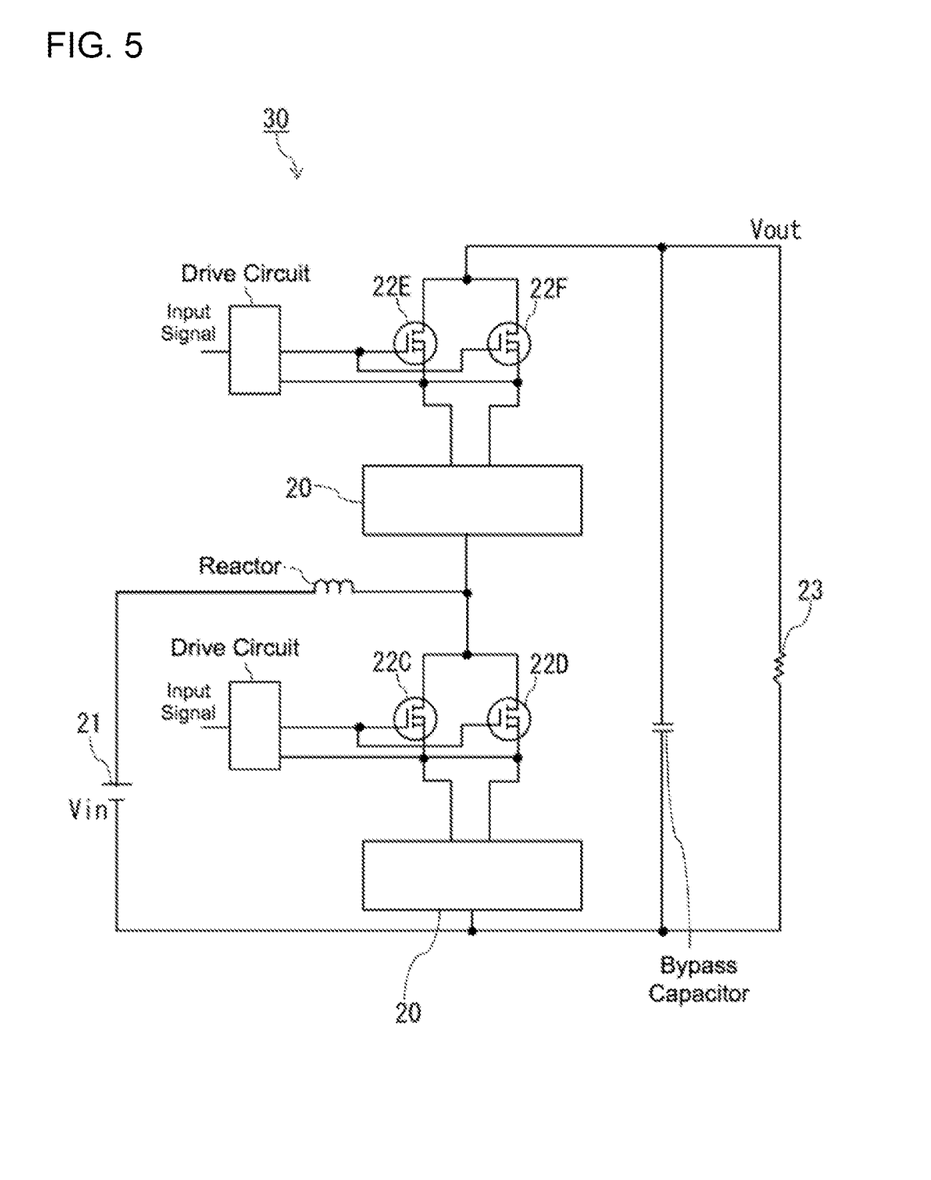
FIG. 5 illustrates a first use example of a current balance adjustment circuit.

A usage example for the current balance adjustment circuit 20 is described next. FIG. 5 illustrates a schematic of a synchronous rectifier boost chopper circuit 30. The synchronous rectifier boost chopper circuit 30 is provided with switching elements (22C, 22D) and switching elements (22E, 22F). The synchronous rectifier boost chopper circuit 30 is also provided with an input power source 21 into which an input voltage Vin enters, a reactor, a diode, a capacitor, and a load 23. The switching elements (22C, 22D) and the switching elements (22E, 22F) are connected respectively in parallel. When an input voltage Vin enters therein from the input power source 21, the synchronous rectifier boost chopper circuit 30 executes switch control of each of the switching elements 22C-22F and outputs Vout which is boosted compared to Vin. A current balance adjustment circuit 20 is connected to the switching elements (22C, 22D) and the switching elements (22E, 22F), respectively. A current balance adjustment circuit 20 thus provided thereby minimizes the variation in current or the surge voltage produced in the switching elements (22C, 22D) and the switching elements (22E, 22F) respectively when a boosted Vout is output, and prevents the destruction of the synchronous rectifier boost chopper circuit 30.

Figure 6:
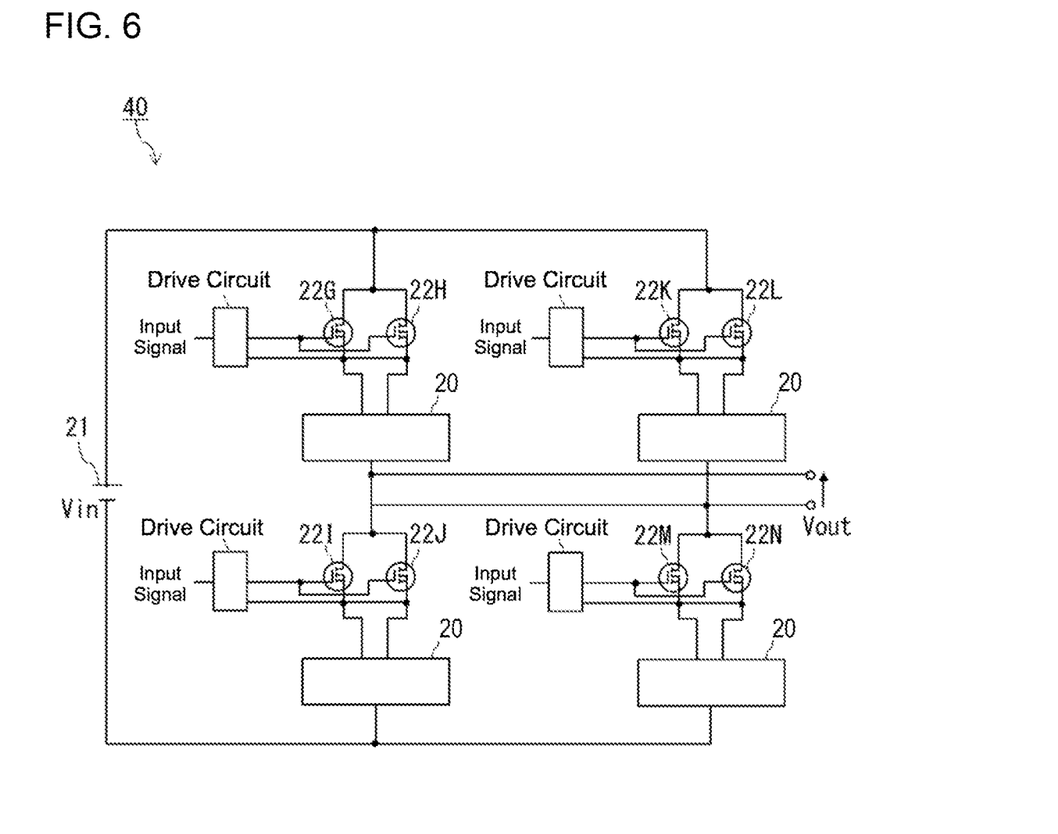
FIG. 6 illustrates a second use example of a current balance adjustment circuit.

FIG. 6 illustrates a separate usage example of the current balance adjustment circuit 20. FIG. 6 is an example of the current balance adjustment circuit 20 used in an inverter circuit 40. The inverter circuit 40 is provided with an input power source 21 which inputs a DC voltage Vin. The switching elements (22G, 22H), the switching elements (22I, 22J), the switching elements (22K, 22L) and the switching elements (22M, 22N) are connected respectively in parallel in the inverter circuit 40. When a DC voltage Vin is applied from the input power source 21 to the inverter circuit 40 thus configured, switch control is carried out for the switching element 22G-22N and an AC voltage Vout is output.

The current balance adjustment circuit 20 is connected to the switching elements (22G, 22H), the switching elements (22I, 22J), the switching elements (22K, 22L) and the switching elements (22M, 22N), respectively. A current balance adjustment circuit 20 thus provided thereby minimizes the variation in current or the surge voltage produced in the switching elements (22G, 22H), the switching elements (22I, 22J), the switching elements (22K, 22L), and the switching elements (22M, 22N), and prevents destruction of the inverter circuit 40.

Outside of the usage examples in FIG. 5 and FIG. 6, the current balance adjustment circuit 20 may also be used in a DC/DC converter or inverter topology to thereby prevent destruction of such device machinery.

Functions and Effects

The above-described kind of current balance adjustment circuit 20 connects a coil 3A and a coil 3B in parallel and couples the coils by reverse poles whereby the coil 3B generates an induced electromotive force in the coil 3A. The induced electromotive force generated by the coil 3B in the coil 3A produces a current responsive to the current id2 flowing in the switching element 22B in the direction the current id2 flows (second term in Equation (1)) in the switching element 22B. The coil 3A similarly generates an induced electromotive force in the coil 3B. The induced electromotive force generated by the coil 3A in the coil 3B produces a current responsive to the current id1 flowing in the switching element 22A in the direction the current id1 flows (second term in Equation (2)) in the switching element 22A. Therefore, the kind of variation illustrated in FIG. 3B and FIG. 3C is minimized even when there is a variation in the quantity of current id1 and quantity of current id2 flowing in each of the switching elements 22A, 22B. The above-described kind of current balance adjustment circuit 20 can minimize the variation in the quantity of current id1 and quantity of current id2 without providing a large impedance in the gate circuit. Therefore, the above described kind of current balance adjustment circuit 20 is capable of reducing the impact on a semiconductor device as much as possible.

The above-described kind of current balance adjustment circuit 20 connects a coil 3A and a coil 4A in parallel and couples the coils by like poles whereby the coil 4A generates an induced electromotive force in the coil 3A. The induced electromotive force generated by the coil 4A in the coil 3A is in the opposite direction (the third term of Equation (1)) to the direction of the quantity of current id1 flowing in the switching element 22A, and is a size responsive to the quantity of current id1. The coil 3A similarly generates an induced electromotive force in the coil 4A. The induced electromotive force generated by the coil 3A in the coil 4A is in the opposite direction (the third term of Equation (2)) to the direction of the quantity of current id1 flowing in the switching element 22A, and is a size responsive to the quantity of current id1. That is, a large induced electromotive force is generated in a circuit connected to the switching element 22A in the opposite direction to the direction the quantity of current id1 flows when said quantity of current id1 flows compared to when the coil 3A is provided independently. In other words, the effect of reducing the aforementioned surge voltage increases compared to when the coil 3A is provided independently even when a surge voltage is produced in the aforementioned circuit. Further, such an effect can be verified in that, in contrast to FIG. 3B, in FIG. 3C, the oscillation of voltage Vds2 is small when the switching elements are first switched on and the voltage Vds2 quickly converges to a fixed value. Therefore, the impact on a semiconductor device can be reduced as much as possible.

In the same manner, the coil 3B and the coil 4B are connected in series and coupled by like poles whereby the coil 4B generates an induced electromotive force in the coil 3B. The induced electromotive force generated by the coil 4B in the coil 3B is in the opposite direction (the third term of Equation (2)) to the direction of the quantity of current id2 flowing in the switching element 22B, and is a size responsive to the quantity of current id2. The coil 3B similarly generates an induced electromotive force in the coil 4B. The induced electromotive force generated by the coil 3B in the coil 4B is in the opposite direction (the second term of Equation (4)) to the direction of the quantity of current id2 flowing in the switching element 22B, and is a size responsive to the quantity of current id2. That is, a large induced electromotive force is generated in a circuit connected to the switching element 22B in the opposite direction to the direction the quantity of current id2 flows when said quantity of current id2 flows compared to when the coil 3B is provided independently. In other words, the effect of reducing the aforementioned surge voltage increases compared to when the coil 3B is provided independently even when a surge voltage is produced in the aforementioned circuit. Further, such an effect can be verified in that, in contrast to FIG. 3B, in FIG. 3C, the oscillation of voltage Vds2 is small when the switching elements are first switched on and the voltage Vds2 quickly converges to a fixed value. Therefore, the impact on a semiconductor device can be reduced as much as possible.

The current balance adjustment circuit 20 in this embodiment is described as one example of a "semiconductor circuit" of this disclosure. However, the current balance adjustment circuit 20A may also serve as one example of a "semiconductor circuit" of this disclosure. This kind of current balance adjustment circuit 20A also provides the effect of minimizing the variation in the quantity of current id1 and quantity of current id2 as illustrated in FIG. 3B.

3. Modification Examples

While an embodiment of the present invention is described above in detail, all points in the previous description are merely examples of the present invention. It goes without saying that various modifications and variations are possible without departing from the scope of the invention. For instance, the following modification is possible. Note that constituent elements that are identical to the constituent elements in the above described embodiment are given the same reference numerals and where appropriate, a description of features that are identical to the above embodiment are omitted. The following modifications may be combined as appropriate.

3.1

A current balance adjustment circuit 20B according to a first modification example is provided with a metal-insulator-metal (MIM) substrate 5. The current balance adjustment circuit 20B uses the parasitic inductance contained in the MIM substrate 5 as a substitute for the coils 3A, 3B and the coils 4A, 4B. More specifically, the parasitic inductance contained in the MIM substrate 5 is utilized to implement the current variation minimizing function and the surge voltage minimizing function achieved by the coils 3A, 3B and the coils 4A, 4B. The above-described kind of current balance adjustment circuit 20B exhibits the same effects as the current balance adjustment circuit 20. Further, the coils 3A, 3B and the coils 4A, 4B are not provided in the current balance adjustment circuit 20B; therefore, the reduction in the number of parts simplifies the manufacturing process, reduces the parts management cost, or allows for achieving more economical parts costs.

3.2

Figure 7A:
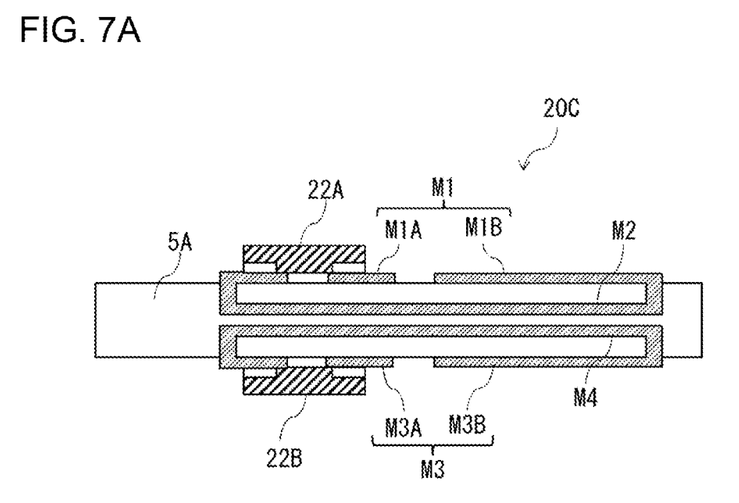
FIGS. 7A and 7B illustrate a schematic of a current balance adjustment circuit according to a second modification example.
Figure 7B:
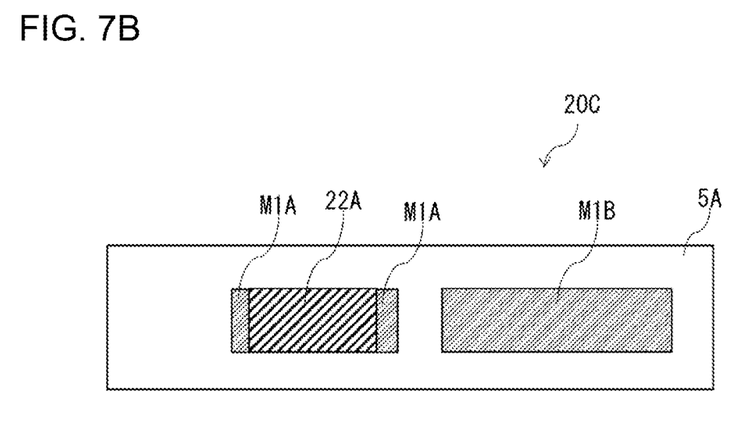

FIG. 7 illustrate a schematic of a current balance adjustment circuit 20C according to a second modification example. FIG. 7A is a schematic cross-sectional view of the current balance adjustment circuit 20C, and FIG. 7B is a schematic top view of the current balance adjustment circuit 20C. As illustrated in FIG. 7, the current balance adjustment circuit 20C is provided with a MIM substrate 5A. The MIM substrate 5A is formed from four metal layers (M1-M4), with an insulating material provided between the metal layers. The M1 layer of the MIM substrate 5A forms the front surface of the MIM substrate 5A (one example of a "third metal layer" in this disclosure). The M1 layer is divided by the insulating material into two regions (M1A, M1B; M1A is one example of a "first portion" in this disclosure, and M1B is an example of a "second portion" in this disclosure); a switching element 22A is mounted on one region M1A. An M2 layer (one example of a "first metal layer" in this disclosure) is provided facing the M1 layer with the insulating material sandwiched therebetween. The M2 layer, and M1A of the M1 layer are connected in series. The M2 layer and M1B are also connected in series.

The M3 layer and M4 layers are structured identically to the M1 layer and the M2 layer. That is, the M3 layer forms the rear surface of the MIM substrate 5A (one example of a "fourth metal layer" in this disclosure). The M3 layer is divided by the insulating material into two regions (M3A, M3B; M3A is one example of a "third portion" in this disclosure, and M3B is an example of a "fourth portion" in this disclosure); a switching element 22B is mounted on one region M3A. An M4 layer (one example of a "second metal layer" in this disclosure) is provided facing the M3 layer with the insulating material sandwiched therebetween. The M4 layer, and the M3A of the M3 layer are connected in series. The M4 layer, and the M3B of the M3 layer are also connected in series. The M4 layer is provided facing the M2 layer with the insulating material sandwiched therebetween. Although not illustrated, the M4 layer and the M2 layer are electrically connected. The M2 layer and M4 layer are one example of a "prescribed metal layer pair" in this disclosure.

For this kind of current balance adjustment circuit 20C, providing the M2 layer and the M4 layer facing each other with the insulating material sandwiched therebetween creates a magnetic coupling between the M2 layer and the M4 layer. In other words, the M2 layer is a substitute for the coil 3A and the M4 layer is a substitute for the coil 3B. Further, providing the M1 layer and the M2 layer facing each other with the insulating material sandwiched therebetween creates a magnetic coupling between M1B of the M1 layer and the M2 layer. In other words, M1B is a substitute for the coil 4A. Further, providing the M1 layer and the M2 layer facing each other with the insulating material sandwiched therebetween creates a magnetic coupling between M1B of the M1 layer and the M2 layer. In other words, M3B is a substitute for the coil 4B.

The above-described kind of current balance adjustment circuit 20C exhibits the same effects as the current balance adjustment circuit 20. Further, the coils 3A, 3B and the coils 4A, 4B are not provided in the current balance adjustment circuit 20C; therefore, the reduction in the number of parts simplifies the manufacturing process, reduces the parts management cost, or allows for achieving more economical parts costs.

The embodiment and modification examples heretofore disclosed may each be combined.

To allow for comparisons between the constituent elements of the present invention and the configuration in the embodiment, the constituent elements of the invention are described together with reference numerals in the drawings.

Supplemental Note 1

A semiconductor circuit (20, 20A, 20B, 20C) including: a first inductor part (3A, M2) configured to connect in series with a source electrode of a first semiconductor element (22A); and
  a second inductor part (3B, M4) configured to connect in series with a source electrode in a second semiconductor element (22B) that is configured to connect in parallel to the first semiconductor element (22A);
  the first inductor part (3A, M2) and the second inductor part (3B, M4) are arranged to generate an induced electromotive force in the first inductor part (3A, M2) and the second inductor part (3B, M4) by way of a magnetic interaction, so that the currents flowing in the first inductor part (3A, M2) and the second inductor part (3B, M4) are reinforced in the same direction.

Supplemental Note 2

The semiconductor circuit (20, 20A, 20B, 20C) described in Supplemental Note 1, further including: a third inductor part (4A, M1B) configured to connect in series with the first inductor part (3A, M2); and
  a fourth inductor part (4B, M3B) configured to connect in series with the second inductor part (3B, M4); wherein the third inductor part (4A, M1B) is arranged to produce a voltage by way of a first induced electromotive force generated due to a magnetic interaction originating from the first inductor part (3A, M2), said voltage of an opposite direction to the voltage applied to the third inductor part (4A, M1B) itself, and to produce a voltage in the first inductor part (3A, M2) by way of the first induced electromotive force generated due to a magnetic interaction from the third inductor part (4A, M1B) itself, said voltage of an opposite direction to the voltage applied to the first inductor part (3A, M2); and
  the fourth inductor part (4B, M3B) is arranged to produce a voltage by way of a second induced electromotive force generated due to a magnetic interaction originating from the second inductor part (3B, M4), said voltage of an opposite direction to the voltage applied to the fourth inductor part (4B, M3B) itself, and to produce a voltage in the second inductor part by way of the second induced electromotive force generated due to a magnetic interaction from the fourth inductor part (4B, M3B) itself, said voltage of an opposite direction to the voltage applied to the second inductor part (3B, M4).

Supplemental Note 3

The semiconductor circuit (20, 20A, 20B, 20C) described in Supplemental Note 1 or 2, wherein at least one of the first inductor part (3A, M2), second inductor part (3B, M4), third inductor part (4A, M1B), and fourth inductor part (4B, M3B) includes a parasitic inductance.

Supplemental Note 4

The semiconductor circuit (20C) described in Supplemental Note 3, including: a plurality of metal layers which are stacked, and an insulating part provided between the plurality of metal layers; and
  a prescribed pair of facing metal layers (M2, M4) from among the plurality of stacked metal layers is electrically connected in parallel; and
  the prescribed pair of metal layers (M2, M4) is the first inductor part (M2) and the second inductor part (M4).

Supplemental Note 5

The semiconductor circuit (20C) described in Supplemental Note 4, wherein the prescribed pair of metal layers (M2, M4) is formed from a first metal layer (M2) and a second metal layer (M4);
  a third metal layer (M1) facing the first metal layer (M2) is divided into a first portion (M1A) and a second portion (M1B) by the insulating part;
  the first portion (M1A), the first metal layer (M2), and the second portion (M1B) are electrically connected in series;
  a fourth metal layer (M3) facing the second metal layer (M4) is divided into a third portion (M3A) and a fourth portion (M3B) by the insulating part;
  the third portion (M3A), the second metal layer (M4), and the fourth portion (M3B) are electrically connected in series;
  the first metal layer (M2) is the first inductor part (M2);

the second metal layer (M4) is the second inductor part (M4);

the second portion (M1B) of the third metal layer (M1) is the third inductor part (M1B); and the fourth portion (M3B) of the fourth metal layer (M3) is the fourth inductor part (M3B).

REFERENCE NUMERALS 3A, 3B: Coil
4A, 4B: Coil
5, 5A: Substrate
15 20, 20A, 20B, 20C: Current balance adjustment circuit
21: Input power source
22A-22N: Switching element
23: Load
30: Synchronous rectifier boost chopper circuit
20 40: Inverter circuit

The invention claimed is:

1. A semiconductor circuit comprising:
a first inductor part to connected in series with a source electrode of a first semiconductor element;
a second inductor part connected in series with a source electrode in a second semiconductor element that is connected in parallel to the first semiconductor element;
a third inductor part connected in series with the first inductor part; and
a fourth inductor part connected in series with the second inductor part, wherein:
the first inductor part and the second inductor part are arranged to generate an induced electromotive force in the first inductor part and the second inductor part by way of a magnetic interaction, so that the currents flowing in the first inductor part and the second inductor part are reinforced in the same direction,
the third inductor part is arranged to produce a voltage by way of a first induced electromotive force generated due to a magnetic interaction originating from the first inductor part, said voltage of an opposite direction to the voltage applied to the third inductor part itself, and to produce a voltage in the first inductor part by way of the first induced electromotive force generated due to a magnetic interaction from the third inductor part itself, said voltage of an opposite direction to the voltage applied to the first inductor part, and the fourth inductor part is arranged to produce a voltage by way of a second induced electromotive force generated due to a magnetic interaction originating from the second inductor part, said voltage of an opposite direction to the voltage applied to the fourth inductor part itself, and to produce a voltage in the second inductor part by way of the second induced electromotive force generated due to a magnetic interaction from the fourth inductor part itself, said voltage of an opposite direction to the voltage applied to the second inductor part.

2. The semiconductor circuit according to claim 1, wherein at least one of the first inductor part, the second inductor part, the third inductor part, and the fourth inductor part includes a parasitic inductance.

3. The semiconductor circuit according to claim 2, wherein:
the semiconductor circuit includes a plurality of stacked metal layers and an insulating part provided between the plurality of stacked metal layers;
a prescribed pair of facing metal layers from among the plurality of stacked metal layers is electrically connected in parallel; and
the prescribed pair of facing metal layers is the first inductor part and the second inductor part.

4. The semiconductor circuit according to claim 3, wherein the prescribed pair of facing metal layers is formed from a first metal layer and a second metal layer;
a third metal layer facing the first metal layer is divided into a first portion and a second portion by the insulating part;
the first portion, the first metal layer, and the second portion are electrically connected in series;
a fourth metal layer facing the second metal layer is divided into a third portion and a fourth portion by the insulating part;
the third portion, the second metal layer, and the fourth portion are electrically connected in series;
the first metal layer is the first inductor part;
the second metal layer is the second inductor part;
the second portion of the third metal layer is the third inductor part; and
the fourth portion of the fourth metal layer is the fourth inductor part.

* * * * *

UNITED STATES PATENT AND TRADEMARK OFFICE
CERTIFICATE OF CORRECTION

| | |
|---|---|
| PATENT NO. | : 11,984,885 B2 |
| APPLICATION NO. | : 17/793847 |
| DATED | : May 14, 2024 |
| INVENTOR(S) | : Noriyuki Nosaka et al. |

It is certified that error appears in the above-identified patent and that said Letters Patent is hereby corrected as shown below:

In the Claims

Claim 1, Column 13, Line 34, should read --way of a magnetic interaction, so that currents--

Signed and Sealed this
Tenth Day of December, 2024

Katherine Kelly Vidal
*Director of the United States Patent and Trademark Office*